United States Patent
Ortet

(10) Patent No.: US 12,143,015 B2
(45) Date of Patent: Nov. 12, 2024

(54) SWITCHED MODE POWER SUPPLY (SMPS)

(71) Applicant: STMicroelectronics (Rousset) SAS, Rousset (FR)

(72) Inventor: Sebastien Ortet, Chateauneuf-le-Rouge (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 247 days.

(21) Appl. No.: 17/731,000

(22) Filed: Apr. 27, 2022

(65) Prior Publication Data

US 2022/0376622 A1  Nov. 24, 2022

(30) Foreign Application Priority Data

May 20, 2021  (FR) ........................ 2105281

(51) Int. Cl.
*H02M 3/158* (2006.01)
(52) U.S. Cl.
CPC .................. *H02M 3/158* (2013.01)
(58) Field of Classification Search
CPC ............................................ H02M 3/156–158
USPC ............................................ 323/271
See application file for complete search history.

(56) References Cited

U.S. PATENT DOCUMENTS

| 9,276,477 | B2 * | 3/2016 | Thomas | H02M 3/158 |
| 2016/0301301 | A1 * | 10/2016 | Kuan | H02M 3/04 |
| 2018/0337599 | A1 * | 11/2018 | Chen | H02M 3/158 |
| 2021/0028700 | A1 * | 1/2021 | Cuenca | H02M 3/156 |

FOREIGN PATENT DOCUMENTS

CN  101764515 A  6/2010

OTHER PUBLICATIONS

Chiu You-Te et al., "A high-performance current-mode DC-DC buck converter with adaptive clock control technique", 2018 International Symposium on VLSI Design, Automation and Test (VLSI-DAT), IEEE, Apr. 16, 2018, 4 pages.

* cited by examiner

*Primary Examiner* — Yemane Mehari
(74) *Attorney, Agent, or Firm* — Slater Matsil, LLP

(57) ABSTRACT

In an embodiment a switching power supply includes a voltage ramp generator comprising at least one output capacitor, wherein the generator is configured such that the output capacitor has a first value during a first operating cycle of a first operating mode and a second value during subsequent operating cycles of the first operating mode.

20 Claims, 3 Drawing Sheets

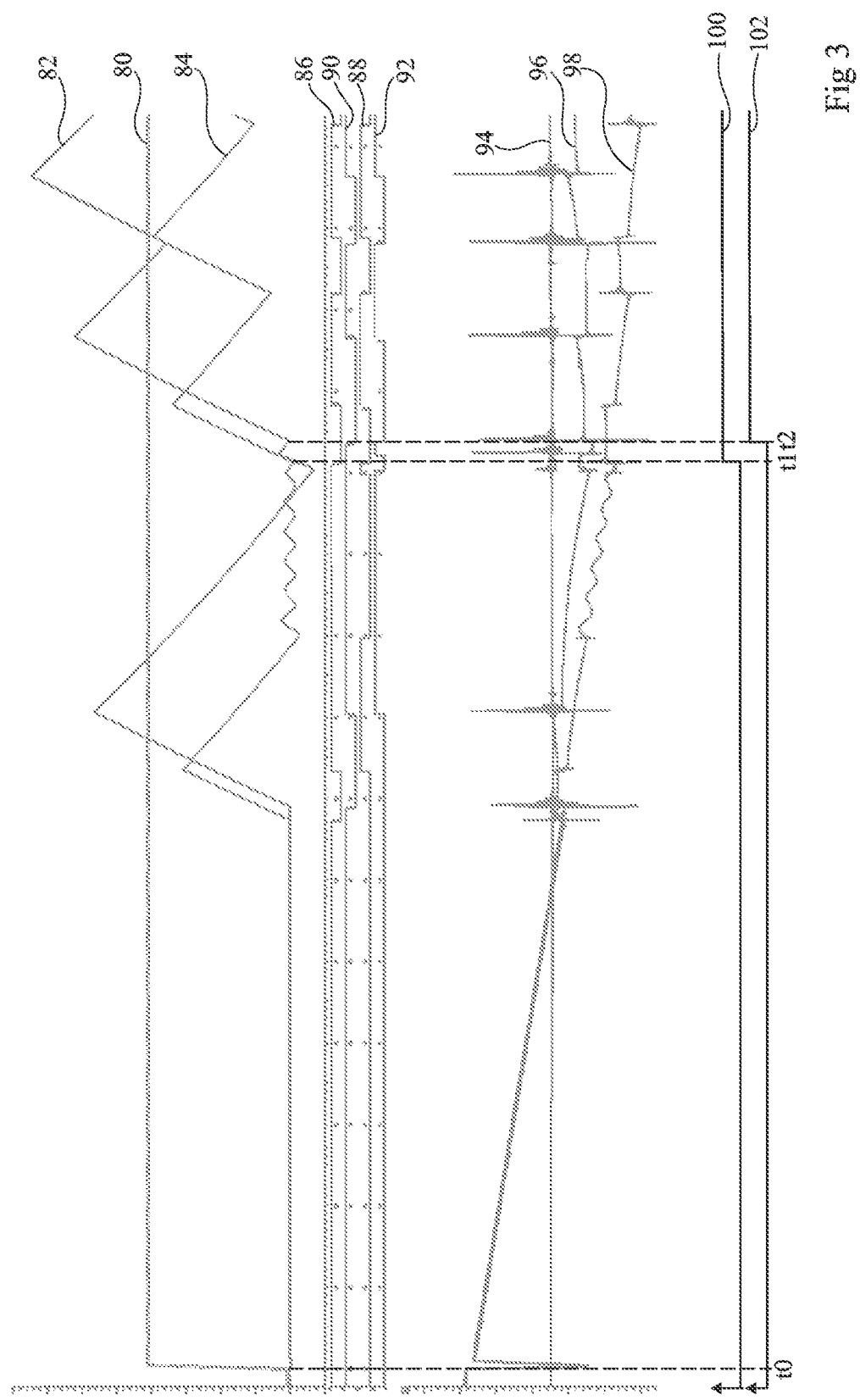

SWITCHED MODE POWER SUPPLY (SMPS)

CROSS-REFERENCE TO RELATED APPLICATIONS

This application is a translation of and claims the priority benefit of French patent application number "FR2105281", filed on May 20, 2021, entitled "Alimentation a decoupage", which is hereby incorporated by reference to the maximum extent allowable by law.

TECHNICAL FIELD

The present disclosure relates to electronic circuits generally, and more particularly to the switched mode power supply (SMPS) type of voltage converters and to their operation. More specifically, the present disclosure relates to switch mode power supplies comprising a voltage generator.

BACKGROUND

In a switched mode power supply type of voltage converter, a converter power supply voltage is cut by switching switches so as to implement energy accumulation phases, in an assembly comprising an inductive element and a capacitive element, and phases of restoration of the energy stored in this assembly to a load connected to the converter output.

A switched mode power supply type of voltage converter can operate in a so-called continuous conduction mode (CCM) such as the pulse width modulation type, i.e. PWM, for example, or the pulse frequency modulation type, i.e. PFM. The voltage converter can also operate in a so-called pulse skipping mode (PSK), for example.

The transition from one mode to another can be problematic. Indeed, this transition can lead to a voltage drop at the output of the converter.

SUMMARY

One embodiment addresses all or some of the drawbacks of known switched mode power supply types of voltage converter.

One embodiment provides a switching power supply comprising a voltage ramp generator, the generator being configured such that the output capacitor of the voltage ramp generator has a first value during a first operating cycle of a first operating mode and has a second value during subsequent operating cycles of the first operating mode.

Another embodiment provides a method for controlling a switching power supply comprising a voltage ramp generator, wherein the output capacitor of the voltage ramp generator has a first value during a first operating cycle of a first operating mode and has a second value during subsequent operating cycles of the first operation mode.

According to one embodiment, the generator comprises a first capacitor and at least one second capacitor, the first and second capacitors being coupled between an output node of the generator at which a voltage ramp is generated and a reference voltage application node, the at least one second capacitor being coupled in series with a switch between the output node and the reference voltage application node, the switch being configured to be closed during the first operating cycle of the first operating mode and open during the remaining operating cycles of the first operating mode.

According to one embodiment, the first capacitor is coupled in series with a switch between the output node and the reference voltage application node.

According to one embodiment, the voltage ramp generator comprises at least two second capacitors.

According to one embodiment, at least some of the switches coupled in series with the second capacitors are controlled by different control signals.

According to one embodiment, the first operating mode is a continuous conduction mode.

According to one embodiment, the power supply comprises a second circuit for controlling the first operating mode, the second circuit comprising a first comparator, configured to compare a power supply output voltage and a setpoint voltage, and a second comparator, configured to compare a first comparator output to a voltage ramp generated by the voltage ramp generator, the second comparator being configured to provide an output signal to the first circuit.

According to one embodiment, the power supply comprises a second operating mode, known as a pulse suppression mode.

According to one embodiment, the power supply comprises a third circuit for controlling the second operating mode, comprising a third comparator configured to compare a voltage ramp generated by the voltage ramp generator and a setpoint voltage, the third comparator being configured to provide a second output signal to the first circuit.

According to one embodiment, the power supply comprises first and second transistors coupled in series between a supply voltage application node and a reference voltage application node, the first and second transistors being coupled to each other by an internal node, the first and second transistors being controlled by a first circuit for generating control signals for the first and second transistors.

According to one embodiment, the voltage ramp generator comprises:—a resistor coupled in series with a first transistor between the power supply voltage application node and the reference voltage application node; —a second transistor and a third transistor coupled in series between the power supply voltage application node and the reference voltage application node; —a fourth transistor coupled between the power supply voltage application node and the output node, the second and fourth transistors being current-mirror coupled; and an operational amplifier, one input of the operational amplifier being coupled to a node coupling the resistor and the first transistor and another input of the operational amplifier being coupled to a node for applying a voltage substantially equal to half the supply voltage, an output of the operational amplifier being coupled to the control terminals of the first and third transistors.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 3 is a set of timing diagrams illustrating the operation of the embodiment of FIG. 2.

DETAILED DESCRIPTION OF ILLUSTRATIVE EMBODIMENTS

Like features have been designated by like references in the various Figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the Figures.

Unless specified otherwise, the expressions "around", "approximately", "substantially" and "in the order of" signify within 10%, and preferably within 5%.

Figure 1:
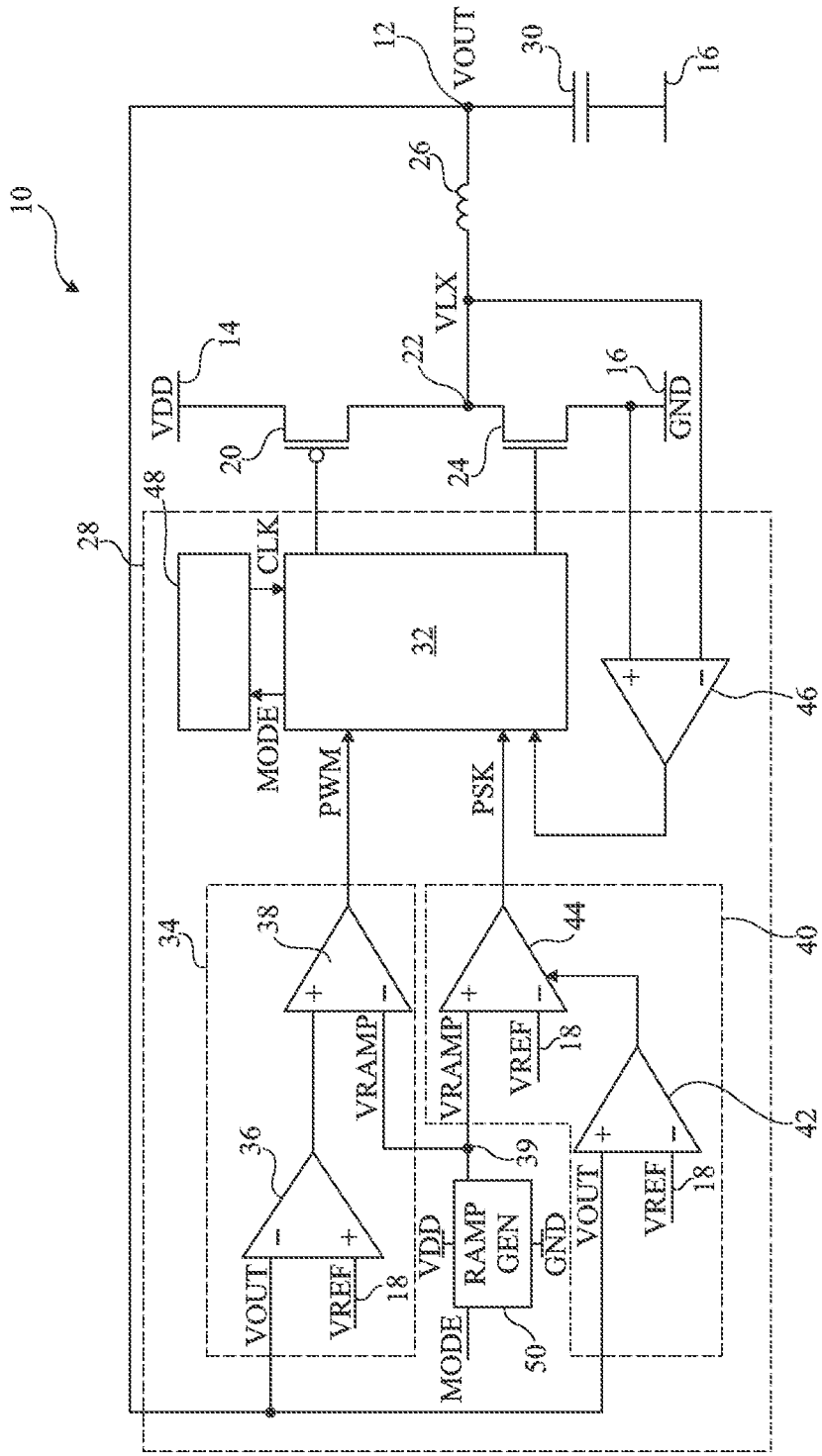
FIG. 1 shows one embodiment of a voltage converter.

FIG. 1 shows one embodiment of a voltage converter 10. The converter 10 is a DC/DC converter, such as a switching power supply, or of a switching power supply type that converts a DC power supply voltage to a DC output voltage.

The converter 10 is configured to provide a DC output voltage VOUT. The converter comprises an output node 12 at which the voltage VOUT is available.

The converter 10 is supplied with a DC power supply voltage VDD. The converter 10 is then connected between a first conductor rail or node, 14, connected to the voltage VDD, and a second conductor rail or node, 16, connected to a reference potential GND, such as ground.

The converter 10 is configured to provide the voltage VOUT at a value substantially equal to a setpoint value. For this, the converter 10 receives a DC setpoint voltage VREF at an input node 18, referenced to the potential GND, for example, the value of which is shown to represent the setpoint value of the voltage VOUT, preferably equal to the setpoint value of the voltage VOUT. In this example, the voltages VOUT, VDD and VREF are positive.

In this example, the converter 10 is a step-down or "buck" type of converter, i.e. the setpoint value of the voltage VOUT is less than the value of the voltage VDD. In other words, the value of the voltage VOUT is less than that of the voltage VDD.

The converter 10 comprises a first metal oxide semiconductor (MOS) transistor 20, preferably a P-channel MOS transistor (PMOS). The MOS transistor 20 is connected between the rail 14 and an internal node 22 to which a voltage VLX is applied. In other words, a first conduction terminal of the transistor 20, such as its source, is connected to the rail 14, with a second conduction terminal of the transistor 20, such as its drain, being connected to the node 22.

The converter 10 further comprises a second MOS transistor 24, preferably an N-channel MOS transistor (NMOS). The transistor 24 is connected between the node 22 and the rail 16. In other words, a first conduction terminal of the transistor 24, such as its source, is connected to the rail 16, with a second conduction terminal of the transistor 24, such as its drain, connected to the node 22.

Thus, the transistors 20 and 24 are connected in series between the rails 14 and 16, and are connected to each other at the internal node 22.

The converter 10 comprises an inductive element or inductor 26. The inductor 26 is connected between the node 22 and the node 12.

The converter 10 comprises a capacitor 30 connected between the node 12 and the rail 16. As an example, this capacitor is in the range of 2.2 µF to 20 µF or more. This capacitor acts as a filter. In other words, this converter capacitor makes it possible to smooth out the current present on the node 12 and to store the energy supplied to the node 12 by the converter.

In operation, a load, not shown, is connected between the node 12 and the rail 16 so as to be powered by the voltage VOUT.

The converter 10 comprises a control circuit 28. The circuit 28 is configured to control the operation of the converter 10 so as to regulate the voltage VOUT so that its value is equal to the setpoint value VREF, for example.

The converter 10 comprises two operating modes, a synchronous operating mode and an asynchronous operating mode.

A first operating mode is called a continuous conduction mode (CCM), of the pulse width modulation (PFM) type, for example, of the pulse frequency modulation (PFM) type, in which each converter operating cycle comprises a phase of accumulation of the energy in the inductor 26 and the capacitor 30 followed by a phase of restoration of the energy of the load connected to the converter. During the energy accumulation phase, the current through the inductive element 26 increases. During the energy restoration phase, the current through the inductive element 26 decreases. This operating mode is a synchronous mode, synchronized by a binary clock signal CLK, at a frequency of 2.4 MHz, for example. Such an operating mode is considered the normal operating mode of the converter, for example.

A second operating mode is called 'pulse skipping' (PSK). In this operating mode, transistor 24 remains off, for example, and transistor 20 is turned on when the output voltage VOUT is lower than a reference voltage, such as the setpoint voltage VREF. Thus, an energy accumulation phase is implemented when the output voltage is lower than the setpoint voltage VREF. Such an operating mode is implemented, for example, when the current drawn by the load is low. This operating mode is an asynchronous operating mode.

The control circuit 28 comprises a circuit 32, such as a state machine, generating the control signals for the transistors 20 and 24. The circuit 32 thus comprises an output coupled, preferably connected, to the control terminal of the transistor 20, at which the control signal for the transistor 20 is provided. The circuit 32 further comprises an output coupled, preferably connected to the control terminal of the transistor 24, on which the control signal of the transistor 24 is provided.

The circuit 32 further comprises an input coupled to a control circuit 34 for the first operating mode, to which the circuit 32 receives a signal PWM determining the amplitude or frequency of the energy accumulation or release phases in the first operating mode, according to the difference between the output voltage VOUT and the setpoint voltage VREF. Thus, the PWM signal is used by the circuit 32 in the first operating mode and is unused during the second operating mode, for example.

The circuit 34 comprises a comparator 36, for example, configured to compare the output voltage VOUT to the setpoint voltage VREF. The comparator 36 comprises an input, preferably a non-inverting input, coupled, preferably connected to the application node 18 of the voltage VREF. The comparator 36 further comprises an input, preferably an inverting input, coupled, preferably connected, to the node 12. The comparator 36 comprises an output at which a signal is provided that represents the difference between the voltage VOUT and the setpoint voltage VREF.

The circuit 34 comprises another comparator 38. The comparator 38 comprises an input, preferably a non-inverting input, coupled, preferably connected to the output of comparator 36. The comparator 38 further comprises another input, preferably an inverting input, coupled, preferably connected to the application node 39 of the voltage VREF. The comparator 38 comprises an output at which it provides the PWM signal. The output of the comparator is coupled, preferably connected to one of the inputs of the circuit 32.

The circuit 32 further comprises an input coupled to a circuit 40. The circuit 40 is configured to control the second operating mode. The circuit 32 receives a PSK signal at this input representing the difference between the output voltage VOUT and the setpoint voltage VREF. From the PSK signal, the circuit 32 determines the starts of the energy accumulation phases during the second operating mode. In other words, for a first value of the PSK signal, obtained when the output voltage is lower than the setpoint voltage VREF, the transistor 20 is conductive so as to allow the capacitor 30 to be charged and the transistor 24 to be off. For a second value of the PSK signal, transistor 20 is off, and the transistor 24 is on. Thus, the PSK signal is used by the circuit 32 in the second operating mode and is not used during the first operating mode, for example.

The circuit 40 comprises a comparator 42, for example, configured to compare the output voltage VOUT to the setpoint voltage VREF. The comparator 40 comprises an input, preferably an inverting input, coupled, preferably connected, to the voltage application node 18 VREF. The comparator 40 further comprises an input, preferably a non-inverting input, coupled, preferably connected, to the node 12. The comparator 40 comprises an output at which a signal is provided that represents the difference between the voltage VOUT and the setpoint voltage VREF.

The circuit 34 comprises another comparator 44. The comparator 44 comprises an input, preferably a non-inverting input, coupled, preferably connected, to the application node 39 of the voltage ramp VRAMP. The comparator 44 further comprises another input, preferably an inverting input, coupled, preferably connected to the application node 18 of the setpoint voltage VREF. The comparator 44 comprises a control input coupled, preferably connected, to the output of the comparator 42. The comparator 44 comprises an output at which the PSK signal is provided for a value of the output signal of the comparator 42. The comparator output is coupled, preferably connected to one of the inputs of circuit 32.

Thus, when the converter 10 is in the first operating mode, the circuit 32 takes into account the PWM signal to determine the control signals for the transistors 20 and 24 and does not take into account the PSK signal. When the converter 10 is in the second operating mode, the circuit 32 takes into account the PSK signal to determine the control signals for the transistors 20 and 24 and does not take into account the PWM signal.

For example, the circuit 28 comprises a comparator 46. The comparator 46 comprises a first input, preferably a non-inverting input, coupled, preferably connected to the application node 16 of the voltage GND, and a second input, preferably an inverting input, coupled, preferably connected to node the 22. The comparator 46 comprises an output coupled, preferably connected to the circuit 32, providing a signal representing the difference between the voltage VLX on the node 22 and the voltage on the node 16. In other words, the comparator provides a signal to the circuit 32 representing the voltage sign VLX. If the converter is operating in the first operating mode and the comparator determines that the voltage VLX is greater than the voltage GND at the end of the clock cycle, the circuit 32 causes the converter to enter the second operating mode.

The circuit 28 comprises a circuit 48 for generating the clock signal CLK, for example. The circuit 28 thus comprises an output coupled, preferably connected to the circuit 32 at which the signal CLK is provided.

The circuit 48 comprises an input coupled, preferably connected, to the circuit 32 on which a signal MODE representing the converter operating mode is provided. For example, the signal MODE assumes a first value when the converter 10 is operating in the first operating mode and a second value when the converter 10 is operating in the second operating mode. Thus, the signal MODE assumes the second value when the converter changes from the first to the second operating mode, i.e. when the comparator 46 determines that the voltage VLX is greater than the voltage GND. For example, the signal MODE assumes the first value when the current drawn by the load increases substantially.

The circuit 28 further comprises a circuit 50 (RAMP GEN) for generating the voltage ramp VRAMP. The circuit 50 preferably receives the supply voltage VDD and the reference voltage GND. Thus, the circuit 50 comprises an input coupled, preferably connected to the node 14 and an input coupled, preferably connected to the node 16. The circuit 50 further receives a control signal, such as the signal MODE. The circuit 50 thus comprises an input coupled, preferably connected to a control signal application node. The circuit 50 further comprises an output on which the voltage ramp VRAMP is generated. This output is coupled, preferably connected to the node 39.

The generator 50 is such that its output capacitance, i.e. the total capacitor capacitance coupled between the output of the voltage ramp generator on which the voltage ramp VRAMP is generated and the reference node, is greater during the first operating cycle of the first operating mode than its output capacitance during subsequent operating cycles of the first operating mode.

The voltage ramp generator 50 comprises at least two capacitors, preferably coupled between the generator output node and the reference node, at least one of which is coupled in series with a switch between a node 68 and the node 16. With said switch configured to be closed during the first operating cycle, i.e. during the first energy accumulation phase and the first energy release phase, after the transition from the second operating mode to the first operating mode and open during the remaining operating cycles of the first operating mode.

During the transition from the second operating mode to the first operating mode, there may be a time period during which a large amount of energy is drawn by the load. With the current passing through the inductor at the end of a cycle in the second operating mode being zero, the capacitor 30 discharges rapidly during this period, which may cause a significant drop in the voltage supplying the load.

Figure 2:
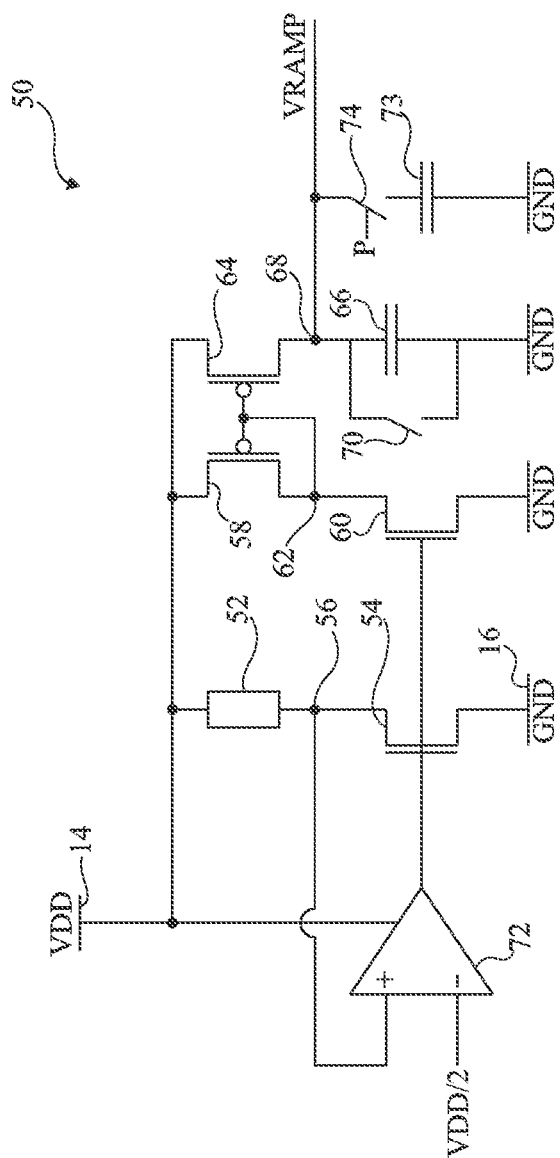
FIG. 2 shows one embodiment of a voltage ramp generator.

FIG. 2 shows one embodiment of a generator 50 of voltage ramps.

The generator 50 comprises a resistor 52 and a transistor 54, such as an NMOS transistor, in series between the application node 14 of the power supply voltage VDD and the application node 16 of the reference voltage GND. More specifically, the resistor 52 is coupled between the node 14 and a node 56. The transistor 54 is coupled between the node 56 and the node 16. More specifically, one terminal of the resistor 52 is coupled, preferably connected to the node 14 and another terminal of the resistor 52 is coupled, preferably connected to the node 56. One terminal of the transistor 54, such as a conduction terminal, i.e. the drain or source is coupled, preferably connected to the node 56, and another terminal, such as the other conduction terminal, is coupled, preferably connected, to the node 16.

The generator 50 comprises a transistor 58, such as a PMOS transistor, and a transistor 60, such as an NMOS transistor, in series between the application node 14 of the power supply voltage VDD and the application node 16 of the reference voltage GND. More specifically, the transistor 58 is coupled between the node 14 and a node 62. The transistor 60 is coupled between the node 62 and the node 16. More specifically, one terminal of the transistor 58, such as a conduction terminal, i.e. the drain or source, is coupled, preferably connected to the node 14 and another terminal, such as the other conduction terminal, is coupled, preferably connected to the node 62. One terminal of transistor 60, such as a conduction terminal, i.e. the drain or source, is coupled, preferably connected to the node 62 and another terminal, such as the other conduction terminal, is coupled, preferably connected, to the node 16.

The generator 50 comprises a transistor 64, such as a PMOS transistor, and a capacitor 66 in series between the application node 14 of the power supply voltage VDD and the application node 16 of the reference voltage GND. More specifically, the transistor 64 is coupled between the node 14 and a node 68. The capacitor 66 is coupled between node 68 and node 16. More specifically, one terminal of the transistor 64, such as a conduction terminal, i.e. the drain or source, is coupled, preferably connected to the node 14 and another terminal, such as the other conduction terminal, is coupled, preferably connected to the node 68. One terminal of the capacitor 66 is coupled, preferably connected to the node 68 and another terminal is coupled, preferably connected to the node 16. A switch 70, such as a transistor, is coupled in parallel with the capacitor 66, for example. Thus, the switch is coupled between the nodes 68 and 16, preferably between the terminals of the capacitor 66. Specifically, one terminal of the switch 70 is coupled, preferably connected to the node 68 and another terminal of the switch 70 is coupled, preferably connected, to the node 16. For example, one terminal of the switch 70 is coupled, preferably connected to one terminal of the capacitor 66 and another terminal of the switch 70 is coupled, preferably connected to another terminal of the capacitor 66. For example, the switch 70 is controlled by a signal representing the state of the transistor 20 (FIG. 1). For example, the switch 70 is open when the transistor 20 is on and closed when the transistor 20 is off. For example, the switch 70 is controlled by the PWM signal (FIG. 1), when the converter is operating in the first operating mode and by the PSK signal when the converter is operating in the second operating mode.

The transistors 54 and 60 are controlled by the same control signal. In other words, the control terminals of the transistors 54 and 60 are coupled, preferably connected to each other.

The transistors 58 and 64 are coupled as a current mirror. The transistors 58 and 64 are controlled by the same control signal. In other words, the control terminals of the transistors 58 and 64 are coupled, preferably connected, to each other. Further, the control terminals of the transistors 58 and 64 are coupled, preferably connected, to the node 62. For example, the control terminals of the transistors 58 and 64 are coupled, preferably connected to the source of the transistor 58.

The generator 50 further comprises an operational amplifier 72. The operational amplifier 72 is powered by the supply voltage VDD. The operational amplifier is thus coupled, preferably connected by an input to the node 14.

The operational amplifier 72 comprises an inverting input (−) receiving a voltage VDD/2 substantially equal to half the supply voltage VDD. The voltage VDD/2 is generated from the supply voltage VDD by a circuit, for example, not shown, such as by a voltage divider, not shown. The operational amplifier 72 comprises a non-inverting input (+) coupled, preferably connected to the node 56. The operational amplifier 72 comprises an output generating the control signal for the transistors 54 and 60. Thus, the output of the operational amplifier 72 is coupled, preferably connected to the control terminals of the transistors 54 and 60.

The generator 50 comprises a capacitor 73 coupled in series with a switch 74 between the node 68 and the node 16. The capacitor 73 and the switch 74 are thus coupled in parallel with the capacitor 66.

The voltage ramp VRAMP is generated at the node 68, which is thus the output node of the generator 50. The node 68 is thus coupled to the node 16 by at least two capacitors, at least one of which is coupled in series with a switch between the node 68 and the node 16.

The switch 74 is controlled by a signal P. The switch 74 thus comprises a control terminal coupled, preferably connected to a signal P application node of the. The switch 74 is configured to be closed during the first operating cycle, i.e. during the first energy accumulation phase and the first energy release phase, after switching from the second operating mode to the first operating mode. The switch 74 is configured to be open during the remaining operating cycles of the first operating mode. In other words, the switch 74 is configured to be closed only during the first operating cycle, when the converter is in the first operating mode, preferably when the converter moves from the second operating mode to the first operating mode. Closing the switch 74 increases the output capacity of the voltage ramp generator and thus increases the duration of growth of the ramp corresponding to the first operating cycle of the first operating mode.

During the second operating mode, the switch 74 is open, for example. Thus, the duration of the energy accumulation phases during the second operating mode is substantially equal to the duration of the energy accumulation phases during the first operating mode, except for the first operating cycle.

In a variant, the switch 74 is closed during the second operating mode, for example. Thus, the voltage ramp VRAMP has a different slope during the second operating mode than during the first operating mode, except for the first operating cycle. Thus, the duration of the energy accumulation phases during the second operating mode is different from the duration of the energy accumulation phases during the first operating mode, except for the first operating cycle.

FIG. 3 is a set of timing diagrams illustrating the operation of the embodiment of FIG. 2. Specifically, FIG. 3 shows:
- the current drawn by the load, by a curve 80;
- the current flowing through the inductor 26 in the case where the voltage ramp generator 50 is that described in relation to FIG. 2, by a curve 82;
- the current flowing through the inductance 26 in the case where the voltage ramp generator 50 comprises only a capacitor coupled between the output node and the reference node, by a curve 84;
- the control signal of transistor 20, by a curve 86, and the control signal of the transistor 24, by a curve 88, in the case where the voltage ramp generator 50 comprises only one capacitor coupled between the output node and the reference node;
- the control signal of transistor 20, by a curve 90, and the control signal of transistor 24, by a curve 92, in the case where the voltage ramp generator 50 is that described in relation to FIG. 2;
- the setpoint voltage VREF, by a curve 94;
  - the output voltage VOUT in the case where the voltage ramp generator 50 is that described in relation to FIG. 2, by a curve 96;
- the output voltage VOUT in the case where the voltage ramp generator 50 comprises only a capacitor coupled between the output node and the reference node, by a curve 98;
- the signal MODE in the case where the voltage ramp generator 50 comprises only one capacitor coupled connected between the output node and the reference node, by a curve 100; and
- the signal MODE in the case where the voltage ramp generator 50 is that described in connection with FIG. 2, by a curve 102.

FIG. 3 illustrates the transition from the second operating mode, i.e. the PSK type of operating mode, to the first operating mode, i.e. the CCM type of operating mode.

The operation of the converter comprises:
- intermediate phases, during which the current through the inductor (curve 82 or 84) is substantially zero and in which the transistors 20 and 24 are blocked, which corresponds to a high value of the control signal of the transistor 20 (curve 86 or 90) and a low value of the control signal of the transistor 24 (curve 88 or 92);
- energy accumulation phases, during which the current through the inductor (curve 82 or 84) is increasing and in which the transistor 24 is blocked and the transistor 20 is conducting, which corresponds to a low value of the control signal of the transistor 20 (curve 86 or 90) and a low value of the control signal of the transistor 24 (curve 88 or 92); and energy restoration phases, during which the current through the inductor (curve 82 or 84) is increasing and in which the transistor 20 is blocked and the transistor 24 is conducting, which corresponds to a high value of the control signal of the transistor 20 (curve 86 or 90) and a high value of the control signal of the transistor 24 (curve 88 or 92).
- At an instant to, the current drawn by the load increases. This causes a drop in the output voltage VOUT. When the voltage VOUT falls below the set value VREF, the converter enters an operating cycle of the second operating mode PSK.

At the end of the operating cycle, i.e. when the current through the inductor 26 returns to zero after at least an energy accumulation phase and an energy restoration phase (instant t1 for the case where the voltage ramp generator 50 comprises only a capacitor coupled between the output node and the reference node and instant t2 for the case where the voltage ramp generator 50 is that described in relation to FIG. 2) the signal MODE changes from a first value to a second value so as to indicate the transition to the first operating mode.

After passing through the first operating mode, operating cycles are linked in such a way as to have the current through the inductor increase until it has an average value substantially equal to the current drawn by the load.

In the case where the voltage ramp generator is that described in connection with FIG. 2, during the first operating cycle, the output capacitor of the voltage ramp generator is greater than the output capacitor of the voltage ramp generator during the remainder of the operating cycles of the first operating mode. Thus, the duration of the power acquisition phase is longer in the first operating cycle of the first operating mode than in the remainder of the operating cycles. As a result, the current through the inductor 26 reaches the current value drawn by the load more quickly. In the example shown in FIG. 3, the curve 82 exceeds the curve 80 in the first operating cycle.

The embodiment of FIG. 2, and specifically the capacitor 73, thus achieves the desired current value more quickly. From the curves 96 and 98, it can be observed that the voltage drop caused at the output voltage VOUT by the change in operating mode is less in the case of the curve 96 than in the case of the curve 98.

It is advantageous to open decreasing the output capacitor of the voltage ramp generator after the first operating cycle of the first operating mode so as to not increase the power consumption and not increase the output voltage VOUT beyond the setpoint voltage VREF.

In a variant, the capacitor 66 (FIG. 2) may be coupled to node 68 by a switch. For example, the capacitance of the capacitor 73 may be greater than the capacitance of the capacitor 66. For example, the output generator capacitance corresponds to the capacitor 73 during the first operating cycle of the first operating mode and to the capacitor 66 during the other operating cycles of the first operating mode. Thus, during the first cycle of the first operating mode, the switch 74 is closed, for example, and the switch coupled between the capacitor 66 and the output node is open, for example, and vice versa during the remainder of the operating cycles of the first operating mode.

In a variant, the generator 50 may comprise more than two capacitors coupled between the output node and the reference node. For example, the generator 50 may comprise at least two capacitors in addition to the capacitor 66, each of the at least two capacitors being coupled connected between the output node and the reference node by a switch. The open or closed states of the switches are selected such that the output capacitance of the generator 50 during the first operating cycle of the first operating mode is greater than its output capacitance during the remaining operating cycles of the first operating mode. In this way, the generator output capacitance can be selected according to various criteria, such as according to the value of the current drawn or according to the load. The control signals for at least some of the switches may thus be different.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

What is claimed is:

1. A switching power supply comprising:
a voltage ramp generator comprising at least one output capacitor,
wherein the voltage ramp generator is configured such that the output capacitor has a first value during a first operating cycle of a first operating mode and a second value during subsequent operating cycles of the first operating mode, the second value being different from the first value, the first operating cycle and the subsequent operating cycles being part of a same continuous conduction mode, the change in capacitance from the first value to the second value being triggered by a change in operating cycle from the first operating cycle to the subsequent operating cycles.

2. The switching power supply according to claim 1, wherein the at least one output capacitor includes a first capacitor and at least one second capacitor,
wherein the first and second capacitors are coupled between an output node of the voltage ramp generator and a reference voltage node,
wherein the at least one second capacitor is coupled in series with a switch between the output node and the reference voltage node,
wherein the switch is configured to be closed during the first operating cycle of the first operating mode and open during the remaining operating cycles of the first operating mode, and
wherein the output node is configured to provide a voltage ramp.

3. The switching power supply according to claim 2, wherein the voltage ramp generator comprises at least two second capacitors.

4. The switching power supply according to claim 3, wherein at least some switches coupled in series with the second capacitors are controllable by different control signals.

5. The switching power supply according to claim 2, wherein the first capacitor is coupled in series with a switch between the output node and the reference voltage node.

6. The switching power supply according to claim 1, further comprising:
a second circuit configured to control the first operating mode,
wherein the second circuit comprises a first comparator configured to compare a power supply output voltage and a setpoint voltage and a second comparator configured to compare a first comparator output to a voltage ramp provided by the voltage ramp generator, and
wherein the second comparator is configured to provide an output signal to a first circuit.

7. The switching power supply according to claim 6, wherein the switching power supply is configured to operate in a second operating mode, the second operating mode being a pulse suppression mode.

8. The switching power supply according to claim 7, wherein the switching power supply comprises a third control circuit configured to control the second operating mode,
wherein the third control circuit comprises a third comparator configured to compare the voltage ramp generated by the voltage ramp generator and the setpoint voltage, and
wherein the third comparator is configured to provide a second output signal to the first circuit.

9. The switching power supply according to claim 1, further comprising:
first and second transistors coupled in series between a supply voltage node and a reference voltage node,
wherein the first and second transistors are coupled to each other by an internal node, and
wherein the first and second transistors are controlled by a first circuit configured to generate control signals for the first and second transistors.

10. The switching power supply according to claim 1, wherein the voltage ramp generator comprises:
a resistor connected in series with a first transistor between a power supply voltage node and a reference voltage node,
a second transistor and a third transistor coupled in series between the power supply voltage node and the reference voltage node,
a fourth transistor coupled between the power supply voltage node and a output node, the second and fourth transistors being connected as current-mirrors, and
an operational amplifier, one input of the operational amplifier being coupled to a node coupling the resistor and the first transistor and another input of the operational amplifier being coupled to a node for applying a voltage substantially equal to half a supply voltage, an output of the operational amplifier being coupled to control terminals of the first and third transistors.

11. A method for controlling a switching power supply comprising a voltage ramp generator, the method comprising:
providing, at least one capacitor of the voltage ramp generator, a first value during a first operating cycle of a first operating mode; and
providing, the at least one capacitor a second value during subsequent operating cycles of the first operating mode, the second value being different from the first value, the first operating cycle and the subsequent operating cycles being part of a same continuous conduction mode, the change in capacitance from the first value to the second value being triggered by a change in operating cycle from the first operating cycle to the subsequent operating cycles.

12. The method according to claim 11, wherein the at least one capacitor includes a first capacitor and at least one second capacitor, wherein the first and second capacitors are coupled between an output node of the voltage ramp generator and a reference voltage node, and wherein the at least one second capacitor is coupled in series with a switch between the output node and the reference voltage node, the method further comprising:
providing, by the output node, a voltage ramp,
wherein the switch is closed during the first operating cycle of the first operating mode and open during the remaining operating cycles of the first operating mode.

13. The method according to claim 12, wherein the voltage ramp generator comprises at least two second capacitors.

14. The method according to claim 13, wherein at least some switches coupled in series with the second capacitors are controllable by different control signals.

15. The method according to claim 12, wherein the first capacitor is coupled in series with a switch between the output node and the reference voltage node.

16. The method according to claim 11, further comprising:
controlling, by a second circuit of the switching power supply, the first operating mode by:
comparing, by a first comparator of the second circuit, a power supply output voltage and a setpoint voltage;
comparing, by a second comparator of the second circuit, a first comparator output to a voltage ramp provided by the voltage ramp generator; and
providing, by the second comparator, an output signal to a first circuit.

17. The method according to claim 16, further comprising:
operating the switching power supply in a second operating mode, the second operating mode being a pulse suppression mode.

18. The method according to claim 17,
controlling, by a third control circuit of the switching power supply, the second operating mode by
compare, by a third comparator of the third control circuit, a voltage ramp generated by the voltage ramp generator and the setpoint voltage, and
providing, by the third comparator, a second output signal to the first circuit.

19. A switching power supply comprising:
a voltage ramp generator comprising at least one output capacitor,
wherein the voltage ramp generator is configured such that the output capacitor has a first value during a first operating cycle of a first operating mode and a second value during subsequent operating cycles of the first operating mode, the second value being different from the first value, the first operating cycle and the subsequent operating cycles being part of a same continuous conduction mode, the change in capacitance from the first value to the second value being triggered by a change in operating cycle from the first operating cycle to the subsequent operating cycles,
wherein the at least one output capacitor includes a first capacitor and at least one second capacitor,
wherein the first and second capacitors are coupled between an output node of the voltage ramp generator and a reference voltage node,
wherein the at least one second capacitor is coupled in series with a switch between the output node and the reference voltage node,
wherein the switch is configured to be closed during the first operating cycle of the first operating mode and open during the remaining operating cycles of the first operating mode, and
wherein the output node is configured to provide a voltage ramp.

20. The switching power supply according to claim 19, wherein the switching power supply is configured to operate in a second operating mode, the second operating mode being a pulse suppression mode.

* * * * *